United States Patent [19]
Schneider et al.

[11] Patent Number: 5,900,670
[45] Date of Patent: * May 4, 1999

[54] STACKABLE HEATSINK STRUCTURES FOR SEMICONDUCTOR DEVICES

[75] Inventors: Mark Schneider; Joseph Joroski, both of San Jose, Calif.

[73] Assignee: LSI Logic Corporation, Milpitas, Calif.

[ * ] Notice: This patent is subject to a terminal disclaimer.

[21] Appl. No.: 08/820,949

[22] Filed: Mar. 19, 1997

Related U.S. Application Data

[63] Continuation of application No. 08/547,277, Oct. 24, 1995, Pat. No. 5,654,587, which is a continuation of application No. 08/093,292, Jul. 15, 1993, abandoned.

[51] Int. Cl.$^6$ .................................................. H01L 23/34
[52] U.S. Cl. .......................... 257/718; 257/722; 361/703; 361/717; 165/80.3
[58] Field of Search ................................ 257/675, 718, 257/719, 721, 722, 796; 165/80.3; 361/689, 703, 717, 718, 719

[56] References Cited

U.S. PATENT DOCUMENTS

| | | | |
|---|---|---|---|
| 2,414,801 | 1/1947 | Clarke | 175/366 |
| 3,205,936 | 9/1965 | Katz | 165/80 |
| 3,372,733 | 3/1968 | Callender | 165/1 |
| 3,388,739 | 6/1968 | Olson et al. | 165/80 |
| 3,413,532 | 11/1968 | Boyer | 317/235 |
| 3,457,988 | 7/1969 | Meyerhoff et al. | 165/80 |
| 4,092,697 | 5/1978 | Spaight | 361/718 |
| 4,158,719 | 6/1979 | Franz | 428/567 |
| 4,340,902 | 7/1982 | Honda et al. | 357/74 |
| 4,345,267 | 8/1982 | Corman et al. | 357/81 |
| 4,396,935 | 8/1983 | Schuck | 357/80 |
| 4,404,582 | 9/1983 | Pollard et al. | 357/79 |
| 4,535,384 | 8/1985 | Wakabayashi . | |
| 4,620,215 | 10/1986 | Lee | 357/81 |
| 4,733,293 | 3/1988 | Gabuzda | 257/697 |
| 4,785,075 | 11/1988 | Shimp | 528/422 |
| 4,788,627 | 11/1988 | Ehlert et al. | 361/717 |
| 4,810,289 | 3/1989 | Hoyer et al. | 75/232 |
| 4,839,422 | 6/1989 | Craig, Jr. | 528/422 |
| 4,849,856 | 7/1989 | Funari et al. | 361/719 |
| 4,909,841 | 3/1990 | Iyer et al. | 75/233 |
| 4,954,170 | 9/1990 | Fey et al. | 75/229 |
| 5,057,903 | 10/1991 | Olla | 257/707 |
| 5,150,195 | 9/1992 | Nguyen | 357/72 |
| 5,155,066 | 10/1992 | Nguyen | 437/209 |
| 5,172,301 | 12/1992 | Schneider | 361/717 |
| 5,175,612 | 12/1992 | Long et al. | 257/667 |
| 5,227,663 | 7/1993 | Patil et al. | 257/718 |
| 5,293,930 | 3/1994 | Pitasi | 165/80.3 |
| 5,310,520 | 5/1994 | Jha et al. | 419/48 |
| 5,410,451 | 4/1995 | Hawthorne et al. | 361/760 |
| 5,514,327 | 5/1996 | Schneider | 419/38 |
| 5,654,587 | 8/1997 | Schneider et al. | 257/718 |
| 5,693,981 | 12/1997 | Schneider et al. | 257/718 |

FOREIGN PATENT DOCUMENTS

| | | |
|---|---|---|
| 54-25168 | 2/1979 | Japan . |
| 59-117244 | 7/1984 | Japan . |
| 2-73657 | 3/1990 | Japan . |

OTHER PUBLICATIONS

St. Marys Carbon Company document entitled "Powder Metallurgy Division".

Sue Oliver, LSI Logic Corporation; My Hguyen and Michael Grosse, Johnson Matthey Electronics, "Siler/Poolymer Die Attach for Ceramic Package Assembly,".

*Primary Examiner*—David Ostrowski

[57] ABSTRACT

A stackable heat sink assembly is formed by press-fit assembly of two or more identical fin layers. Each fin layer is formed using powdered metallurgy and has a button-like projection extending from its bottom surface and a recess opening in its top surface. The button-like projection and recess opening are sized and shaped such that an interference fit is formed when the button-like projection of one fin layer is pressed into the recess of another fin layer. The use of an adaptor to increase or decrease the effective size of the button-like projection of the bottommost fin layer is described. Relieving gases that may be entrapped in the recess during assembly is described. Circular, elliptical and polygonal shapes (outlines) for the fin layers are described.

54 Claims, 3 Drawing Sheets

STACKABLE HEATSINK STRUCTURES FOR SEMICONDUCTOR DEVICES

CROSS-REFERENCE TO RELATED APPLICATIONS

This is a continuation of application Ser. No. 08/547,277, filed on Oct. 24, 1995, now U.S. Pat. No. 5,654,587, which is a continuation of application Ser. No. 08/093,292, filed Jul. 15, 1993, now abandoned.

TECHNICAL FIELD OF THE INVENTION

The invention relates to heat sinks for semiconductor device assemblies.

BACKGROUND OF THE INVENTION

As used herein, a "semiconductor device" is a silicon chip (die) containing circuit elements. A "semiconductor device assembly" is a silicon chip contained within a package and connected (wired or bonded) to conductive leads which exit the package.

Heat is inevitably generated during operation of a semiconductor device, and may become destructive of the device if left unabated. The problem of heat dissipation is especially relevant in semiconductor devices that have a high lead count (e.g., high I/O) or which operate at high speeds, both of which factors contribute significantly to the generation of heat by the device.

It is generally well known to provide some sort of heat sink for semiconductor devices. Heat sinks generally include at least a heat-transferring portion positioned in close proximity to the semiconductor device (die) for efficiently extracting heat therefrom, and a heat-dissipating portion remote from the die with a large surface area for dissipating heat. The heat-dissipating portion is typically formed with a number of parallel fin layers, through which air passes to remove heat from the heat sink. Typically, the entire heat sink structure may simply be disposed on an exterior of a package, such as on the lid of a lidded package.

Commonly-owned U.S. Pat. No. 5,175,612 discloses a heat sink for semiconductor device assembly. As shown for example in FIG. 3 therein, the heat sink has a fixed portion embedded within the semiconductor chip assembly and an "add-on" portion which resides entirely exterior the semiconductor chip assembly. The fixed portion extends to close proximity with the die, and terminates in a flat upper surface forming an exterior surface of the semiconductor chip assembly. The add-on portion, shown as having two fins, is provided with a button which fits into a recess in the upper surface of the fixed portion. This two-part heat sink arrangement exhibits some degree of "flexibility" in that various add-on portions can be formed with different configurations.

Heat sinks are typically machined from metal stock, such as copper which has a high thermal conductivity. Evidently, many machine operations are required to form the fin layers, and much of the stock is removed in the machining operation. While the removed stock may be recovered, it represents initial waste.

The cost of machining is relatively high, and is exacerbated by the need to fabricate different heat sink structures for different devices. For example, one heat sink may have three fins, while another nearly identical heat sink requires five fins. With machining, there is little or no flexibility to accommodate differences from one heat sink to another.

U.S. Pat. No. 4,340,902 discloses a heat sinking arrangement wherein a cooling fin assembly is press-fitted around a cooling stud (see, e.g., FIG. 1 therein), and a similar arrangement wherein a cooling fin assembly is threaded onto a cooling stud (see, e.g., FIG. 2 therein). Also disclosed (see, e.g., FIGS. 3 and 4 therein) is an arrangement wherein a cooling stud is preformed with cooling fins in the form of a single unitary structure.

DISCLOSURE OF THE INVENTION

It is therefore an object of the present invention to provide a improved technique for manufacturing heat sinks.

It is another object of the invention to provide a heat sink structure that is readily adapted to a number of different configurations.

According to the invention, a heat sink is formed of a number "n" of similar, preferably identical, individual, stackable fin layers. The first, bottom-most fin layer in the stack has a generally flat top surface with a generally centrally located recess extending into the top surface. The second and subsequent fin layers in the stack have a top surface similar (e.g., identical, including the recess) to the top surface of the first fin layer, and have a stepped bottom surface. A first projection extends from the bottom surface of fin layer, forming a "shoulder" for a second, smaller projection, extending generally centrally from the first projection, forming a button-like projection from the "shoulder" or first projection. The button-like projection is sized to fit into the recess in the top surface of the previous fin layer in an interference fit. Because of the interference fit, the second fin layer is assembled to the first fin layer by pressing them together under force. This button-like projection of the second fin layer is then "captured" by the recess in the top surface of the first fin layer, forming a secure mechanical assembly of the two fin layers. Subsequent fin layers are assembled to the first and second fin layers in much the same manner. A plurality of fin layers can be assembled all at once by arranging them in a stack and pressing the entire stack together. The bottom surface of the bottom fin layer is preferably identical to the bottom surfaces of the remaining fin layers.

Each resulting fin layer is preferably disc-like, having a circular outline (plan view). However, to better match the outline of a package (which is typically not circular), the fin layers can be formed with polygonal or elliptical outlines. This will result in a greater surface area for each fin layer, within the "footprint" of the package. Similarly, the button-like projection, recess, and "shoulder" can be circular, elliptical, or polygonal. In the event that the outline of the fin layer is not circular (e.g., square, rectangular, elliptical) then it has an inherent "orientation". Accordingly, in such cases it can be advantageous to form non-circular shapes for the button-like projection and recess to provide "keying", or common orientation between fin layers.

The recess is located generally in the center of the fin layer on the top surface (side). The "shoulder" is formed on the bottom side of the fin layer as a generally centrally located region of increased thickness. The button-like projection is disposed generally at the center of the fin layer, opposite the recess, and extending from the "shoulder" region of increased thickness. Intimate contact between the top surface of one fin layer and the shoulder of a subsequent fin layer ensures a good thermal path from layer-to-layer.

It should be understood that the button element can be provided on the top surface of the fin layer and the recess can be provided on the bottom surface of the fin layer, but this is not preferred.

In use, the fin layers are assembled together by press fit, and the assembly is mounted directly to a semiconductor die package, such as by gluing (with a thermally-conductive adhesive) to the lid of the package. Alternatively, an "adaptor" may be interposed between the bottommost fin layer and the semiconductor package.

According to an aspect of the invention, the button element is slightly larger (e.g., in diameter) than the recess. For example, the button element may be one-half mil larger than the recess. Additionally, the button element may have a taper (draft), for example on the order of 3 degrees. This ensures a snug press fit between the assembled fin layers. Preferably, the recess is at least as deep as the height of the button-like projection, to ensure complete mating between adjacent fin layers.

According to a feature of the invention, either the recess or the button may be provided with a groove or hole for permitting potentially entrapped gases (e.g., air) to escape during the press fit procedure.

According to another feature of the invention, a thermally conductive substance, e.g., silicone grease, can be disposed between the assembled fin layers (e.g., spread on the shoulder of each fin layer) to improve thermal transfer from layer-to-layer. The use of thermal grease, while advantageous, if allowed to form a film on either the button or the recess may tend increase the necessity for relief grooves or holes to permit entrapped gases to escape during assembly.

The fin layers are formed of a thermally-conductive material, such as copper, or a copper alloy. The topmost fin layer may have a top surface that is dissimilar from the top layers of the remaining fin layers, but this is not preferred.

The bottommost fin layer may have a bottom surface that is dissimilar from the bottom surfaces of the remaining fin layers, so that the bottommost fin layer is especially suited to being disposed in close proximity to a semiconductor die or its package, but this is not preferred. For example, the bottom surface of the bottommost fin layer may be formed to mate with an element of the semiconductor package (see, e.g., FIG. 3 of U.S. Pat. No. 5,175,612). Alternatively, the bottom surface of the bottommost fin layer can be identical to the bottom surfaces of the remaining fin layers, and an adaptor can be interposed between the bottom layers.

In use, the fin layers are assembled together by press fit, and the assembly is mounted directly to a semiconductor die package, such as by gluing (with a thermally-conductive adhesive) to the lid of a lidded package. Alternately, an "adaptor" may be interposed between the bottommost fin layer and the semiconductor package, especially to accommodate a pre-formed recess or button in the semiconductor package.

According to the invention, any number "n" of fin layers may be pre-assembled together, prior to mounting to a semiconductor package. In this manner, a wide variety of heat sinks can be formed for different applications from a supply of identical fin layer elements.

According to an aspect of the invention, the fin layers are formed of powdered metal, or they may be formed of stamped out metal.

According to an aspect of the invention, the fin layers are assembled into a stack, so that the resulting heat sink has "n" fin layers, in accordance to the particular application for which it is intended.

Preferably, the fin layers are pressed together prior to assembling the heat sink to a semiconductor assembly. Alternatively, a first fin layer can be assembled to the semiconductor assembly and remaining fin layers can be pressed into the first in a separate operation. This is not preferred, however, as it may subject the semiconductor package to excessive forces.

The fin layers are preferably manufactured using powdered metal technology, (powder metallurgy) from thermally-conductive materials such as aluminum, copper, or copper/tungsten.

Powder metallurgy is a highly developed method of manufacturing reliable ferrous and nonferrous parts. Made by mixing elemental or alloy powders and compacting the mixture in a die, the resultant shapes are then sintered or heated in a controlled-atmosphere furnace to metallurgically bond the particles.

The advantages of using powder metallurgy (versus machining) include eliminating or minimizing machining and eliminating or minimizing scrap losses.

By using the stackable fin configuration and techniques of the present invention, an inexpensive heatsink is provided using powder metallurgy technology whereby inexpensive fin layers are pressed together to construct the desired number of fins which constitute the heatsink whole. Using powder metallurgy, copper may be cost-effectively used as opposed to the costly machining techniques from raw metal stock.

The heat sink of the present invention provides a low-cost, high heat dissipation heat sink for semiconductor applications.

Other objects, features and advantages of the invention will become apparent in light of the following description thereof.

DETAILED DESCRIPTION OF THE INVENTION

According to the invention, a stacked heat sink assembly is formed of a number "n" of similar, preferably identical, individual, stackable fin layers. The first, bottom-most fin layer in the stack has a generally flat top surface with a generally centrally located recess extending into the top surface. The second and subsequent fin layers in the stack have a top surface similar (e.g., identical, including the recess) to the top surface of the first fin layer, and have a stepped bottom surface. A first projection extends from the bottom surface of fin layer, forming a "shoulder" for a second, smaller projection, extending generally centrally from the first projection, forming a button-like projection from the "shoulder" or first projection. The button-like projection is sized to fit into the recess in the top surface of the previous fin layer in an interference fit.

Figure 1A:
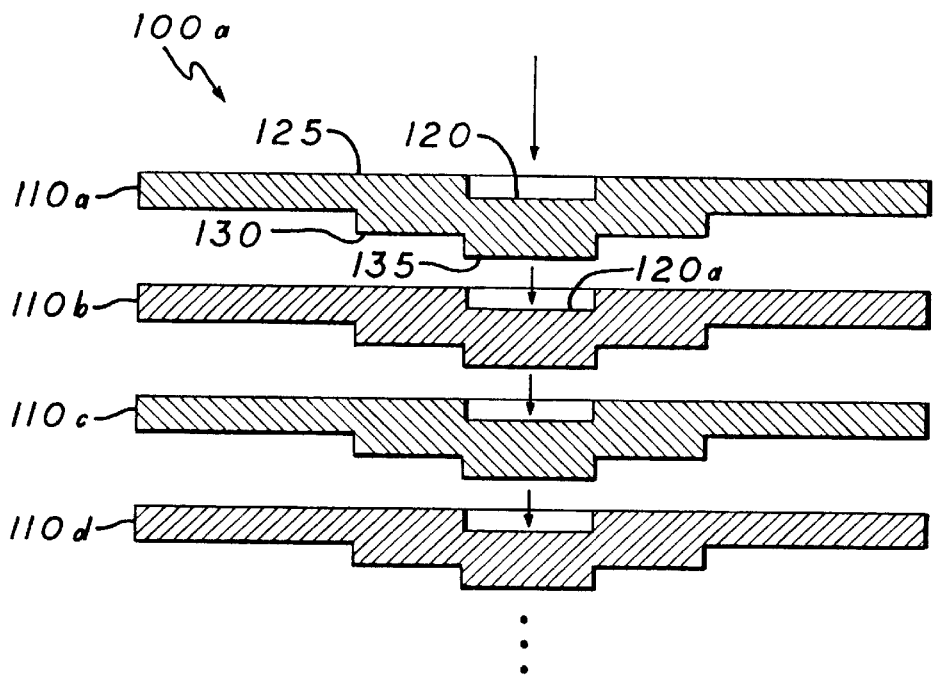
FIG. 1a is a cross-sectional view of four stackable fin layers of a stacked heat sink assembly, according to the invention, prior to assembly.

FIG. 1a shows such an arrangement 100a of fin layers, prior to assembly. The arrangement 100a includes four identical, fin layers 110a, 110b, 110c, and 110d. The topmost fin layer 110a, representative of the others (110b, c, and d) has a substantially flat top surface 125, with a recess 120 formed therein in a generally central location. An outer region of the fin layer 110a has a thickness "t".

A shoulder projection 130 extends from a central region of the bottom surface of the fin layer 110a. The shoulder region is somewhat thicker (such as twice as thick, or 2t) as the outer fin region.

A button-like projection 135, smaller (in width) than the shoulder projection 130, extends a distance approximately t/2 from a central portion of the shoulder projection 130. The button-like projection 135 is preferably located immediately under (opposite) the recess 120. Although not shown in the Figure, edges of the button-like projection 135 and recess 120 are preferably chamfered, to facilitate inserting the button-like projection 135 of one layer (e.g., 110a) into a recess 120a of the next lower fin layer (e.g., 110b). The four fin layers 110a, 110b, 110c, and 110d are shown arranged in a stacked vertical configuration with the button-like projection of one fin layer positioned above and extending towards the recess of the next lower fin layer. The direction of assembly is shown with a series of arrows. The button-like projection 135 is slightly larger (e.g., in diameter) than the recess 120. For example, the button element may be one-half mil (0.0005 inches) larger than the recess. Additionally, the button element may have a taper (draft), for example on the order of 3 degrees. This ensures a snug press fit between the assembled fin layers. Preferably, the recess is at least as deep as the height of the button-like projection, to ensure complete mating between adjacent fin layers.

The fin layers are preferably formed of powdered metal, but they may also be formed of stamped out metal. In either case, the fin layers are formed of a thermally-conductive material such as aluminum, copper, or copper/tungsten. Copper is a preferred choice of metals.

Figure 1B:
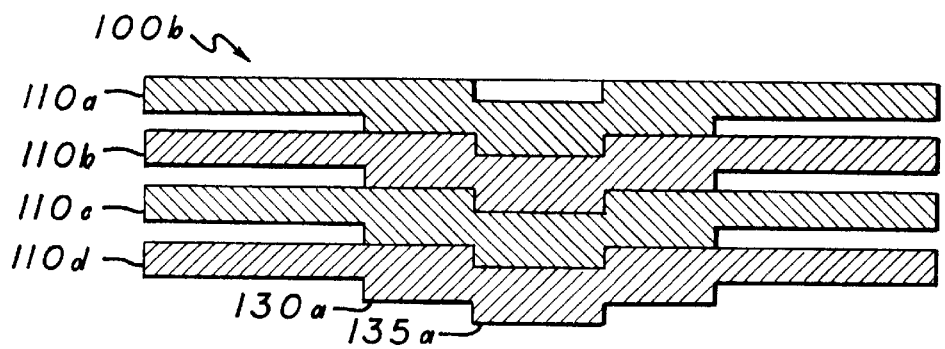
FIG. 1b is a cross-sectional view of an assembled heat sink assembly including four fin layers, according to the invention.

FIG. 1b shows an assembled stacked heat-sink assembly 100b, formed by pressing the arrangement 100a of FIG. 1a together in the direction shown by the arrows. A press fit is formed between the button-like projection of each fin layer and the recess of the next lower fin-layer. The shoulder projection 130a and button-like projection of the bottommost fin layer 110d extend from the bottom of the assembly. The shoulder projection (e.g. 130) of each fin layer is in direct contact with a central region of the top surface of the next lower fin layer, providing good thermal conductivity therebetween.

In order to further promote thermal conductivity between fin layers of the stacked heat sink assembly, it is possible to dispose a small amount of a thermally conductive material, e.g., silicone grease (not shown), between the fin layers prior to assembly. The thermally conductive material, by increasing thermal contact area and by filling tiny gaps between the shoulder projections and top surfaces of the fin layers, serves to improve thermal conductivity between the fin layers.

Although FIGS. 1a and 1b depict an assembly of four fin layers, any number of fin layers greater than two can be assembled into a similar stacked heat sink assembly.

Each fin layer is preferably disc-like, having a circular outline (looking down onto the heat sink). However, the fin layers can also have polygonal or elliptical outlines.

Each button and recess (and shoulder portion) similarly have a circular outline (looking down onto the heat sink). However, the button and recess (and shoulder portion) can also have polygonal or elliptical outlines.

In the event that the overall shape (outline) of the fin layer is not circular (e.g., square, rectangular, elliptical) then it has an inherent "orientation" not found in circles. Accordingly, in such cases it can be advantageous to form non-circular, or otherwise "keyed" shapes for the button-like projection and recess to provide a common, uniform orientation for the assembled fin layers.

The top-most fin layer can have a top surface that is dissimilar from the top layers of the remaining fin layers, but this is not preferred. Similarly, the bottom-most fin layer can have a bottom surface that is dissimilar from the bottom surfaces of the remaining fin layers, but this is not preferred. It is preferred that each fin layer is a replication of each other fin layer.

In use, the fin layers are assembled together by press fitting, and the assembly is mounted directly to a semiconductor die package, such as by gluing (with a thermally-conductive adhesive) to an exterior surface of the package.

Alternatively, an "adaptor" may be interposed between the bottommost fin layer and the semiconductor package. Examples of such adapters are shown in FIGS. 2 and 3.

Figure 2:
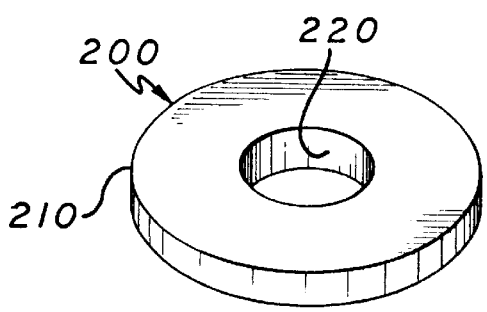
FIG. 2 is a perspective view of a doughnut-shaped adapter, according to the invention.

FIG. 2 is a perspective view of a diameter-increasing, doughnut-shaped adapter 200 used to increase the effective diameter of a round button-like projection of a fin layer (e.g., of the bottommost fin layer). A recess or hole 220, generally centrally located in the adapter 200, is sized and shaped to form an interference fit with a mating button-like projection (e.g., 135a, FIG. 1b). The outer edge 210 of the adapter effectively provides a larger diameter button-like projection from a fin layer to which the adaptor is assembled. This larger diameter projection can be used, for example to form an interference fit with a large (larger than the button-like projection of the fin layer) recess in a semiconductor package to which the stacked heat sink is to be assembled.

Additionally, the doughnut-shaped adapter 200 can be used simply to increase the effective surface area (footprint) available for adhesion to (and thermal conduction from) a planar surface of a semiconductor device package, such as to the lid of a lidded package. In this manner (using the adaptor 200), the bottommost fin layer can have a button of greater effective contact area than the remaining fin layers, although the bottommost fin layer is identical to each of the remaining fin layers.

Figure 3:
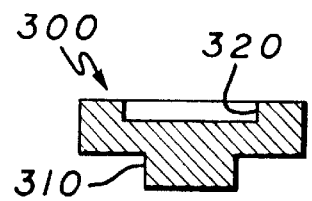
FIG. 3 is a cross-sectional view of a reducing adapter, to according to the invention.

FIG. 3 is a cross-sectional view of a reducing adapter 300, having a top recess 320 sized to form a press fit (interference fit) with a button-like projection of a fin layer, and having a smaller button-like projection 310 opposite the recess. This adapter can be used to facilitate a press fit into a package recess which is smaller than the button-like projection of a fin layer.

Although the adapters 200 and 300 shown and described with respect to FIGS. 2 and 3, respectively are generally assumed to be round in shape, they can also be shaped to accept elliptical or polygonal button-like projections, and to provide non-circular button like projections (e.g., 310 FIG.

3) or outer surface shapes (e.g., 210, FIG. 2). In other words, the adaptor 200 may have a circular hole 220 for accepting the button of the bottommost fin layer, and can have a square outline that matches the area of a lid of a lidded package.

Figure 4:
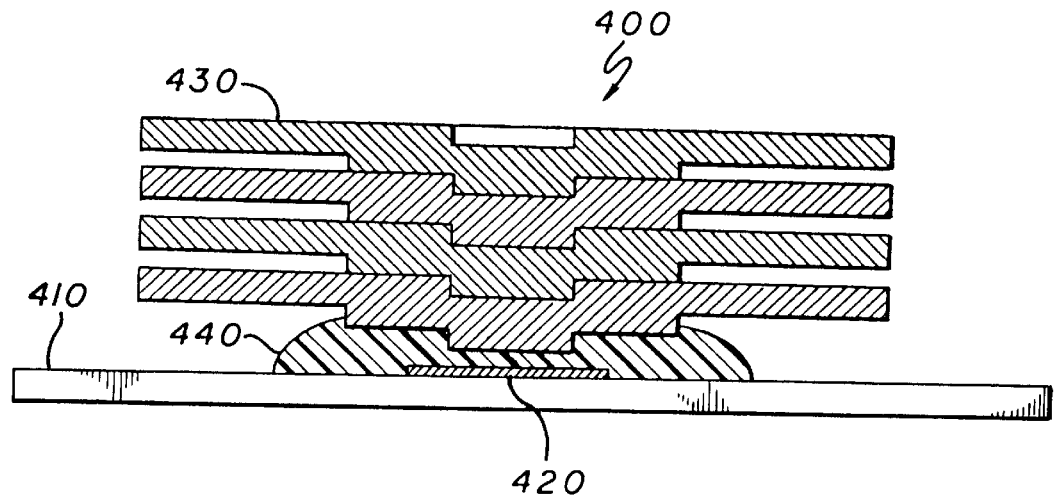
FIG. 4 is a cross-sectional view of an assembly of a stacked heat sink arrangement to a glob-top type package, according to the invention.
Figure 5:
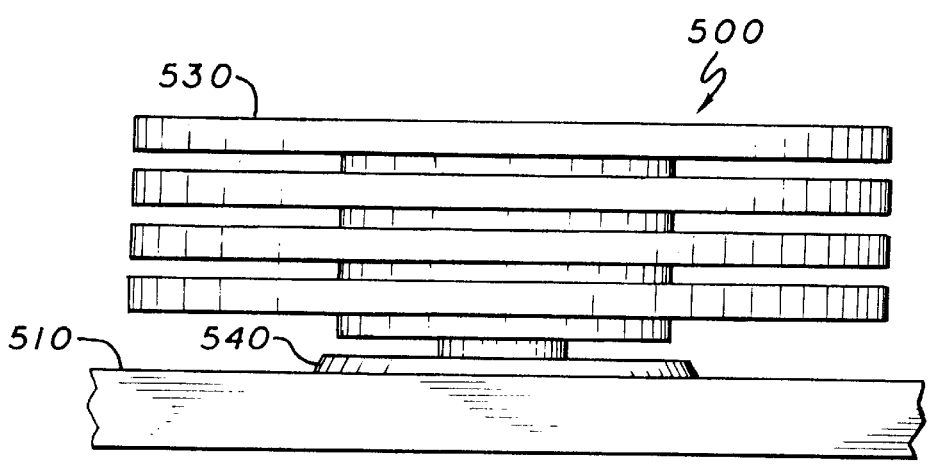
FIG. 5 is a view of an assembly of a stacked heat sink assembly to a lid of a lidded (e.g., ceramic) semiconductor device package, according to the invention.

FIGS. 4 and 5 show examples of package assemblies incorporating the stacked heat-sink assemblies described hereinabove.

FIG. 4 is a cross-sectional view of a semiconductor package assembly 400 formed on a planar substrate 410. A semiconductor die 420 is attached to the planar substrate (e.g., with a suitable adhesive). Connections (not shown) are formed between the semiconductor die 420 and conductive traces (not shown) on the substrate. A dollop 440 of epoxy or other encapsulant is used to cover the die and its electrical connections. A stacked heat sink assembly 430 (see, e.g., 100b, FIG. 1b) is embedded in the epoxy dollop 440 such that the button-like projection on its bottom surface is in close proximity with the semiconductor die 420, thereby providing means for dissipating heat generated in the operation of the die 420.

FIG. 5 is a side view of another semiconductor package assembly 500 incorporating a stacked heat sink assembly 530. In this case a package 510, such as a ceramic package, with a metallic lid 540 is used. The stacked heat sink assembly is attached by its button-like projection to the lid 540 by using a heat conductive adhesive, thereby providing for heat transfer from the package by conduction from the lid 540. As mentioned above, an adaptor (e.g., 200) can be used to increase the contact area between the bottommost fin layer and the lid of the package.

Figure 6A:
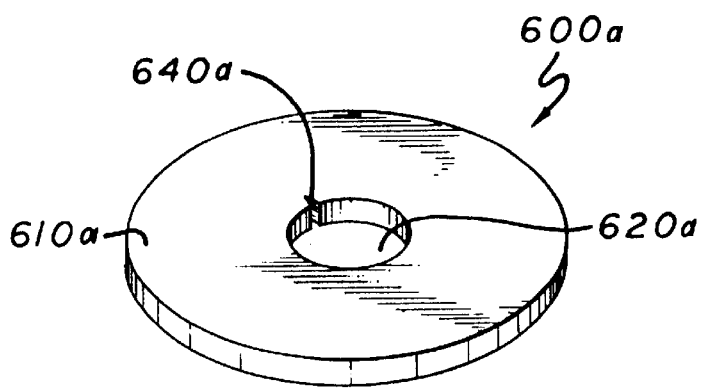
FIG. 6a is a perspective view of a fin layer incorporating a gas relief groove in the recessed portion thereof, according to the invention.
Figure 6B:
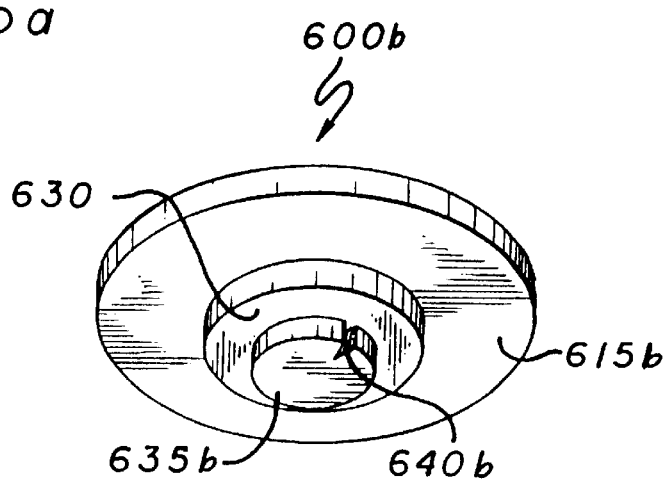
FIG. 6b is a perspective view of a fin layer incorporating a gas relief groove in the button-like projection portion thereof.
Figure 6C:
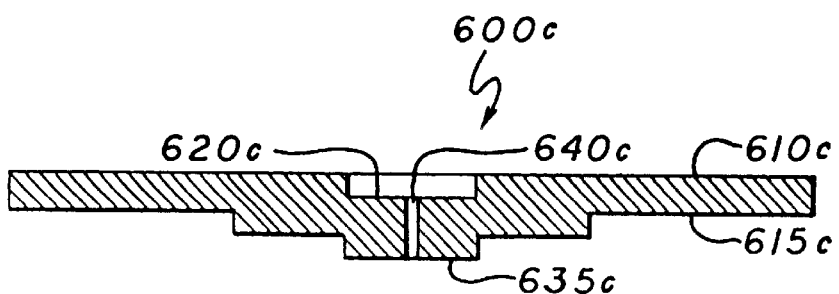
FIG. 6c is a cross-sectional view of a fin layer incorporating a gas relief hole, according to the invention.

In the process of press-fitting the fin layers together, it is possible that gases (air) will become entrapped in the recess, especially if thermal grease is used and forms a "sealing" film between the button and the recess. According to a feature of the invention, either the recess or the button may be provided with a groove or hole for permitting entrapped gases (e.g., air) to escape during the press fit procedure. FIGS. 6a–6c show various exemplary embodiments of gas relief grooves and holes.

FIG. 6a is a perspective view of a fin layer 600a, as viewed generally from the top. The top surface 610a of the fin layer 600a has a recess 620a extending therein, as described hereinabove (e.g., compare 120). A gas-relief groove 640a is formed in the side wall of the recess, providing a path for gas to escape during press fit with a button-like projection of another similar fin layer.

FIG. 6b is a perspective view of another fin layer 600b, as viewed generally from the bottom. A shoulder projection 630 extends from the bottom surface 615b of the fin layer 600b. A button-like projection 635b extends from the shoulder projection 630. A gas-relief groove 640b is formed in the button-like projection 635b to permit gases to escape during press-fit assembly to another similar fin layer.

FIG. 6c is a cross-sectional view of another fin layer 600c, illustrating yet another approach to permitting trapped gases to escape during press-fit assembly. The fin layer 600c (compare 430) has a generally flat top surface 610c. Extending into the top surface 610c is a recess 620c. Extending from a bottom surface 615c of the fin layer 600c is button-like projection 635c, located directly under the recess 620c. A gas-relief hole 640c extends from the center of the button-like projection completely through the fin layer 600c to the recess 620c on the opposite side of the fin layer 600c. The hole 640c is yet another way of permitting trapped gases to escape during press-fit assembly.

Gas-relief holes may not be necessary in all assemblies, since many possible fin layer designs will not trap enough gas or build up enough pressure to interfere with press-fit assembly or functioning of the stacked heat sink assembly.

According to the invention, any number "n" of fin layers may be pre-assembled together, prior to mounting to a semiconductor package. In this manner, a wide variety of heat sinks can be formed for different applications from a supply of identical fin layer elements.

According to an aspect of the invention, the fin layers are assembled into a stack, so that the resulting heat sink has "n" fin layers, in accordance to the particular application for which it is intended.

Preferably, the fin layers are pressed together prior to assembling the heat sink to a semiconductor assembly. Alternatively, a first fin layer can be assembled to the semiconductor assembly and remaining fin layers can be pressed into the first in a separate operation. This is not preferred, however, as it may subject the semiconductor package to excessive forces.

By using the stackable fin configuration and techniques of the present invention, an inexpensive heatsink is provided using powder metallurgy technology whereby inexpensive fin layers are pressed together to construct the desired number of fins which constitute the heatsink whole. Using powder metallurgy, copper may be cost-effectively used as opposed to the costly machining techniques from raw metal stock. The heat sink of the present invention provides a low-cost, high heat dissipation heat sink for semiconductor applications.

What is claimed is:

1. A self-stackable heatsink structure for semiconductor devices, comprising:
    a heatsink first fin layer having a button-like projection;
    a gas relief groove formed in a side wall of said button-like projection; and
    a heatsink second fin layer having a recess, said button-like projection and said recess opening are sized and shaped such that a secure mechanical-lock interference fit is formed when said button-like projection is pressed into said recess.

2. The self-stackable heatsink structure of claim 1 wherein a gas relief hole extends into said button-like projection and through said first fin layer.

3. The self-stackable heatsink structure of claim 1 wherein a gas relief groove is formed in a side wall of said recess.

4. The self-stackable heatsink structure of claim 1 wherein said recess is chamfered.

5. The self-stackable heatsink structure of claim 1 wherein said button-like projection is chamfered.

6. The self-stackable heatsink structure of claim 1 wherein said button-like projection is tapered.

7. The self-stackable heatsink structure of claim 1 further comprising a heat conducting substance disposed between said first and second fin layers.

8. The self-stackable heatsink structure of claim 1 wherein said first fin layer has a shoulder projection and said button-like projection extends out a distance relative to said shoulder projection.

9. The self-stackable heatsink structure of claim 8 wherein said button-like projection has a smaller width than said shoulder projection.

10. The self-stackable heatsink structure of claim 8 wherein said shoulder projection extends from a shoulder region of said first fin and disposed centrally relative to an outer fin region of said first fin, and said shoulder region is twice as thick as said outer fin region.

11. The self-stackable heatsink structure of claim 1 wherein said recess is at least as deep as the height of said button-like projection.

12. The self-stackable heatsink structure of claim 1 wherein said first fin layer includes a recess on a side thereof opposite to said button-like projection.

13. The self-stackable heatsink structure of claim 12 further comprising a third fin layer having a button-like projection adapted to securely interference fit into said recess of said first fin layer.

14. The self-stackable heatsink structure of claim 1 further comprising an adapter interposed between a bottommost one of said fin layers and a semiconductor device.

15. The self-stackable heatsink structure of claim 1 wherein both said first and second fin layers comprise solid, planar fin assemblies.

16. The self-stackable heatsink structure of claim 1 wherein said second fin layer has a button-like projection of a fin surface opposite to that of said recess.

17. A self-stackable heatsink structure for semiconductor devices, comprising:
a heatsink first fin layer having a button-like projection; and
a heatsink second fin layer having a recess, said button-like projection and said recess opening are sized and shaped such that a secure mechanical-lock interference fit is formed when said button-like projection is pressed into said recess;
wherein a gas relief hole extends into said button-like projection and through said first fin layer.

18. The self-stackable heatsink structure of claim 17 further comprising a gas relief groove formed in a side wall of said button-like projection.

19. The self-stackable heatsink structure of claim 17 wherein a gas relief groove is formed in a side wall of said recess.

20. The self-stackable heatsink structure of claim 17 wherein said first fin layer has a shoulder projection and said button-like projection extends out a distance relative to said shoulder projection, and wherein said button-like projection has a smaller width than said shoulder projection.

21. The self-stackable heatsink structure of claim 17 further comprising an adapter interposed between a bottommost one of said fin layers and a semiconductor device.

22. A self-stackable heatsink structure for semiconductor devices, comprising:
a heatsink first fin layer having a button-like projection; and
a heatsink second fin layer having a recess, said button-like projection and said recess opening are sized and shaped such that a secure mechanical-lock interference fit is formed when said button-like projection is pressed into said recess;
wherein a gas relief groove is formed in a side wall of said recess.

23. The self-stackable heatsink structure of claim 22 further comprising a gas relief groove formed in a side wall of said button-like projection.

24. The self-stackable heatsink structure of claim 22 wherein a gas relief hole extends into said button-like projection and through said first fin layer.

25. The self-stackable heatsink structure of claim 22 wherein said first fin layer has a shoulder projection and said button-like projection extends out a distance relative to said shoulder projection, and wherein said button-like projection has a smaller width than said shoulder projection.

26. The self-stackable heatsink structure of claim 22 further comprising an adapter interposed between a bottommost one of said fin layers and a semiconductor device.

27. A self-stackable heatsink structure for semiconductor devices, comprising:
a heatsink first fin layer having a button-like projection; and
a heatsink second fin layer having a recess, said button-like projection and said recess opening are sized and shaped such that a secure mechanical-lock interference fit is formed when said button-like projection is pressed into said recess;
wherein said recess is chamfered.

28. The self-stackable heatsink structure of claim 27 further comprising a gas relief groove formed in a sidewall of said button-like projection.

29. The self-stackable heatsink structure of claim 27 wherein said button-like projection is chamfered.

30. The self-stackable heatsink structure of claim 27 wherein said button-like projection is tapered.

31. The self-stackable heatsink structure of claim 27 wherein said first fin layer has a shoulder projection and said button-like projection extends out a distance relative to said shoulder projection, and wherein said button-like projection has a smaller width than said shoulder projection.

32. A self-stackable heatsink structure for semiconductor devices, comprising:
a heatsink first fin layer having a button-like projection; and
a heatsink second fin layer having a recess, said button-like projection and said recess opening are sized and shaped such that a secure mechanical-lock interference fit is formed when said button-like projection is pressed into said recess;
wherein said button-like projection is chamfered.

33. The self-stackable heatsink structure of claim 32 further comprising a gas relief groove formed in a side wall of said button-like projection.

34. The self-stackable heatsink structure of claim 32 wherein said recess is chamfered.

35. The self-stackable heatsink structure of claim 32 wherein said button-like projection is tapered.

36. A self-stackable heatsink structure for semiconductor devices, comprising:
a heatsink first fin layer having a button-like projection; and
a heatsink second fin layer having a recess, said button-like projection and said recess opening are sized and shaped such that a secure mechanical-lock interference fit is formed when said button-like projection is pressed into said recess;
wherein said button-like projection is tapered.

37. The self-stackable heatsink structure of claim 36 wherein a gas relief hole extends into said button-like projection and through said first fin layer.

38. The self-stackable heatsink structure of claim 36 wherein said first fin layer has a shoulder projection and said button-like projection extends out a distance relative to said shoulder projection, and wherein said button-like projection has a smaller width than said shoulder projection.

39. A self-stackable heatsink structure for semiconductor devices, comprising:
a heatsink first fin layer having a button-like projection; and
a heatsink second fin layer having a recess, said button-like projection and said recess opening are sized and shaped such that a secure mechanical-lock interference fit is formed when said button-like projection is pressed into said recess;

wherein said first fin layer has a shoulder projection and said button-like projection extends out a distance relative to said shoulder projection, and wherein said button-like projection has a smaller width than said shoulder projection.

40. The self-stackable heatsink structure of claim 39 wherein said shoulder projection extends from a shoulder region of said first fin and disposed centrally relative to an outer fin region of said first fin, and said shoulder region is twice as thick as said outer fin region.

41. A self-stackable heatsink structure for semiconductor devices, comprising:

a heatsink first fin layer having a button-like projection;

a heatsink second fin layer having a recess, said button-like projection and said recess opening are sized and shaped such that a secure mechanical-lock interference fit is formed when said button-like projection is pressed into said recess;

wherein said first fin layer includes a recess on a side thereof opposite to said button-like projection; and a heatsink third fin layer having a button-like projection adapted to securely interference fit into said recess of said first fin layer.

42. The self-stackable heatsink structure of claim 41 further comprising an adapter interposed between a bottom-most one of said fin layers and a semiconductor device.

43. The self-stackable heatsink structure of claim 41 wherein said second fin layer has a button-like projection on a fin surface opposite to that of said recess.

44. The self-stackable heatsink structure of claim 41 further comprising a gas relief groove formed in a side wall of said recess.

45. A self-stackable heatsink structure for semiconductor devices, comprising:

a heatsink first fin layer having a button-like projection;

a heatsink second fin layer having a recess, said button-like projection and said recess opening are sized and shaped such that a secure mechanical-lock interference fit is formed when said button-like projection is pressed into said recess; and an adapter interposed between a bottommost one of said fin layers and a semiconductor device.

46. The self-stackable heatsink structure of claim 45 further comprising a gas relief groove formed in a side wall of said button-like projection.

47. The self-stackable heatsink structure of claim 45 wherein both said first and second fin layers comprise solid, planar fin assemblies.

48. A self-stackable heatsink structure for semiconductor devices, comprising:

a first solid planar fin assembly having a button-shaped projection; and a second solid planar fin assembly having a recess;

wherein said first and second fin assemblies are stacked with said button-shaped projection in said recess with press fit securement; and wherein said button-shaped projection has a gas relief groove formed in a side wall thereof.

49. The self-stackable heatsink structure of claim 48 wherein a gas relief hole extends into said button-shaped projection and through said first fin assembly.

50. The self-stackable heatsink structure of claim 48 wherein a gas relief groove is formed in a side wall of said recess.

51. A self-stackable heatsink structure for semiconductor devices, comprising:

a first solid planar fin assembly having a button-shaped projection; and a second solid planar fin assembly having a recess;

wherein said first and second fin assemblies are stacked with said button-shaped projection in said recess with press fit securement; and wherein a gas relief hole extends into said button-shaped projection and through said first fin assembly.

52. The self-stackable heatsink structure of claim 51 wherein said button-shaped projection has a gas relief groove formed in a side wall thereof.

53. A self-stackable heatsink structure for semiconductor devices, comprising:

a first solid planar fin assembly having a button-shaped projection; and a second solid planar fin assembly having a recess;

wherein said first and second fin assemblies are stacked with said button-shaped projection in said recess with press fit securement; and wherein a gas relief groove is formed in a side wall of said recess.

54. The self-stackable heatsink structure of claim 53 wherein a gas relief hole extends into said button-shaped projection and through said first fin assembly.

* * * * *